(12) United States Patent  (10) Patent No.: US 9,059,053 B2
Liang et al.  (45) Date of Patent: Jun. 16, 2015

(54) MULTI-DIE STACK STRUCTURE

(71) Applicant: NANYA TECHNOLOGY CORPORATION, Taoyuan (TW)

(72) Inventors: Zer Liang, Ibaraki Prefecture (JP); Kotaro Suzuki, Ibaraki Prefecture (JP)

(73) Assignee: NANYA TECHNOLOGY CORPORATION, Taoyuan (TW)

( * ) Notice: Subject to any disclaimer, the term of this patent is extended or adjusted under 35 U.S.C. 154(b) by 16 days.

(21) Appl. No.: 14/044,879

(22) Filed: Oct. 3, 2013

(65) Prior Publication Data

US 2015/0097296 A1  Apr. 9, 2015

(51) Int. Cl.
*H01L 23/48* (2006.01)
*H01L 23/52* (2006.01)
*H01L 29/40* (2006.01)
*H01L 23/00* (2006.01)
*H01L 23/538* (2006.01)
*H01L 25/065* (2006.01)

(52) U.S. Cl.
CPC ............ *H01L 24/14* (2013.01); *H01L 23/5384* (2013.01); *H01L 25/0657* (2013.01); *H01L 2224/1405* (2013.01); *H01L 2225/06544* (2013.01)

(58) Field of Classification Search
CPC .............. H01L 23/481; H01L 23/5226; H01L 2924/01079
USPC ........... 257/660, 774, 777, E23.141; 438/107
See application file for complete search history.

(56) References Cited

U.S. PATENT DOCUMENTS

2006/0118972 A1* 6/2006 Baek et al. .................... 257/786
2011/0050320 A1* 3/2011 Gillingham .................. 327/365
2012/0139092 A1* 6/2012 Su et al. ....................... 257/660

* cited by examiner

*Primary Examiner* — Phuc Dang
(74) *Attorney, Agent, or Firm* — Jianq Chyun IP Office

(57) ABSTRACT

A multi-die stack structure including N dies stacked vertically is described. N is an integer larger than or equal to 2. Each die includes N die-specific input pads, wherein a specific pad among the N pads is for the input of the die. The specific pad of each die above the bottom die is electrically connected with a different pad of the bottom die other than the specific pad of the bottom die, via at least one TSV and, when not being in the die neighboring to the bottom die, also via a different pad of each underlying die above the bottom die. The specific pad of the bottom die is electrically connected with at least one pad of the overlying die(s) that is not the specific pad of any overlying die and not any pad electrically connected with the specific pad of any overlying die.

12 Claims, 1 Drawing Sheet

MULTI-DIE STACK STRUCTURE

BACKGROUND

1. Field of the Invention

The invention relates to an integrated circuit structure, and particularly relates to a multi-die stack structure.

2. Description of Related Art

Multi-die stack structures are often applied to electronic products that require increased memory density and/or device performance in a reduced package size.

FIG. 1 illustrates a conventional multi-die stack structure of QDP (quad-die package) type with a "ladder-style" connection between the dies that is based on CS (Chip-Select) pads. Such a structure is currently applied to DDR3 SDRAM (Double-Data-Rate Three Synchronous Dynamic Random Access Memory).

Referring to FIG. 1, the structure includes four dies 12, 14, 16 and 18 vertically stacked from bottom to top. Each die 12, 14, 16 or 18 has four CS pads including a CS0 pad 101 for the input of the die, a CS1 pad 103 for the input of the 1-level higher die (if present), a CS2 pad 105 for the input of the 2-level higher die (if present), and a CS3 pad 107 for the input of the 4-level higher die (if present), wherein the CS pads 101, 103, 105 and 107 of the dies 12, 14, 16 and 18 are connected in a "ladder style" via through-substrate via (TSV). More specifically, in each $i^{th}$ die (i=2 to 4) 14, 16 or 18, the $j^{th}$ pad (j=1 to 3) 101, 103 or 105 is electrically connected with the (j+k)-th pad of each (i−k)-th die (k=1 to i−1), with a proviso of j+k≤4.

However, the ladder-style connection in DDR3 SDRAM suffers from large input-capacitance (Cin) difference between the CS/ZQ pads. This can most likely be attributed to the loading difference seen by the respective CS pads. As shown in FIG. 1, the CS0 pad 101 has 0-TSV/1-pad loading, the CS1 pad 103 has 1-TSV/2-pad loading, the CS2 pad 105 has 2-TSV/3-pad loading, and the CS3 pad 105 has 3-TSV/4-pad loading. That is, a CS(n+1) pad has an extra 1-TSV/1-pad loading as compared to a CS(n) pad.

SUMMARY OF THE DISCLOSURE

Accordingly, this invention provides a multi-die stack structure that is capable of reducing the input capacitance (Cin) difference between die-specific input pads.

The multi-die stack structure of this invention includes N dies stacked vertically. N is an integer larger than or equal to 2. Each die includes N of die-specific input pads, wherein a specific pad among the N pads is for the input of the die. The specific pad of each die above the bottom die is electrically connected with a different pad of the bottom die other than the specific pad of the bottom die, via at least one through-substrate via and, when not being in the die neighboring to the bottom die, also via a different pad of each underlying die above the bottom die. The specific pad of the bottom die is electrically connected with at least one pad of the overlying die(s) that is not the specific pad of any overlying die and not any pad electrically connected with the specific pad of any overlying die.

Because the specific pad of the bottom die is electrically connected with at least one pad of the overlying die(s) that is not the specific pad of any overlying die and not any pad electrically connected with the specific pad of any overlying die, at least the Cin difference between the specific pad of the bottom die (having the lowest Cin in the prior art) and those of the overlying dies is reduced. Thereby, the variation in the respective external input CS signals is reduced to reduce the variation in the die-to-die CS-pin setup/holding timing, and the variation in the result of the calibration using the ZQ pads is also reduced.

When the die-specific input pads of the dies have a ladder-style connection as described above, it is even possible that the die-specific input pads of all the dies have substantially the same Cin or substantially no Cin-difference. Such an embodiment is described as follows. The N dies comprise, from bottom to top, $1^{st}$ to $N^{th}$ dies, wherein the $1^{st}$ die is the bottom die. In each die, the N pads comprise $1^{st}$ to $N^{th}$ pads in sequence, wherein the $1^{st}$ pad is the specific pad for the input of the die. In each $i^{th}$ die (i=2 to N), the $j^{th}$ pad (j=1 to N−1) is electrically connected with the (j+k)-th pad of each (i−k)-th die (k=1 to i−1), with a proviso of j+k≤N. The specific pad of the $1^{st}$ die is electrically connected with the $N^{th}$ pad of the $2^{nd}$ die via a through-substrate via in the $1^{st}$ die. The specific pad of each $m^{th}$ die (m=2 to N−1) is also electrically connected with the $N^{th}$ pad of the (m+1)-th die via a through-substrate via in the $m^{th}$ die. The specific pad of the $N^{th}$ die is also electrically connected with a through-substrate via that is in the $N^{th}$ die and over the $N^{th}$ pad of $N^{th}$ die.

In the above embodiment, the specific pad of each die is electrically connected with the same number of other pad(s) and the same number of TSV(s), so there is substantially no Cin-difference between the specific pads of the dies.

In order to make the aforementioned and other objects, features and advantages of this invention comprehensible, a preferred embodiment accompanied with figures is described in detail below.

DESCRIPTION OF EMBODIMENTS

This invention will be further explained with an embodiment, which is however not intended to restrict the scope of this invention. For example, though N is equal to 4 in the embodiment, N may alternatively be less or more than 4, such as 2 or 8.

Figure 2:
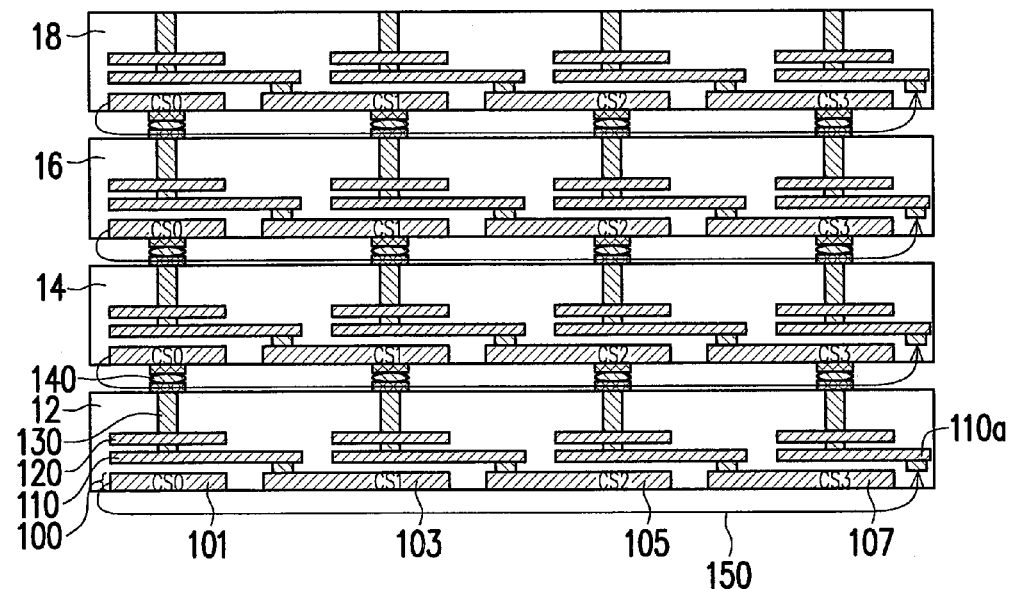
FIG. 2 illustrates a multi-die stack structure of QDP type according to an embodiment of this invention, which also has a ladder-style connection between the dies that is based on CS (Chip-Select) pads.

FIG. 2 illustrates a multi-die stack structure of QDP type according to an embodiment of this invention, which has a ladder-style connection between the dies that is based on CS (Chip-Select) pads.

In each of the dies 12, 14, 16 and 18, the metal layer 110 having been defined into the CS0 pad 101, the CS1 pad 103, the CS2 pad 105, the CS3 pad 107 and the other pads (not shown, including ZQ pads and so on) may be the third metal (M3) layer of the die 12, 14, 16 or 18.

The ladder-style connection is described in details below.

In the $2^{nd}$ die 14, the CS0 pad 101 as the specific die for the input of the $2^{nd}$ die 14 is electrically connected with the CS1 pad 103 of the $1^{st}$ die 12 via a solder ball 140, a TSV 130 in the $1^{st}$ die 12, the first metal (M1) layer 120 of the $1^{st}$ die 12, the second metal (M2) layer 110 of the $1^{st}$ die 12, and certain intermediate metal layers and plugs respectively between the CS0 pad 101 of the $2^{nd}$ die 14 and the solder ball 140, between the solder ball 140 and the TSV 130, between the M1 layer 120 and the M2 layer 110, and between the M2 layer 110 and the CS1 pad 103 of the $1^{st}$ die 12. Such connection structure can be considered as a 1-step ladder. It is noted that for the simplicity of description, the solder ball 140, the M1 layer 120, the M2 layer 110, the intermediate metal layers and the plugs in the electrical conduction path, which less affect the input capacitance, are not mentioned in the following descriptions.

In the $3^{rd}$ die 16, the CS0 pad 101 is electrically connected with the CS1 pad 103 of the $2^{nd}$ die 14 via a TSV 130 in the $2^{nd}$ die 14, and with the CS2 pad 105 of the $1^{st}$ die 12 via a TSV 130 in the $1^{st}$ die 12. Such a connection structure can be considered as a 2-step ladder.

In the $4^{th}$ die 18, the CS0 pad 101 is electrically connected with the CS1 pad 103 of the $3^{rd}$ die 16 via a TSV 130 in the $3^{rd}$ die 16, with the CS2 pad 105 of the $2^{nd}$ die 14 via a TSV 130 in the $2^{nd}$ die 14, and with the CS3 pad 107 of the $1^{st}$ die 12 via a TSV 130 in the $1^{st}$ die 12. Thus, the CS0 pad 101 of the $4^{th}$ die 18 sees three other CS pads and three TSVs 130. Such a connection structure can be considered as a 3-step ladder.

Figure 1:
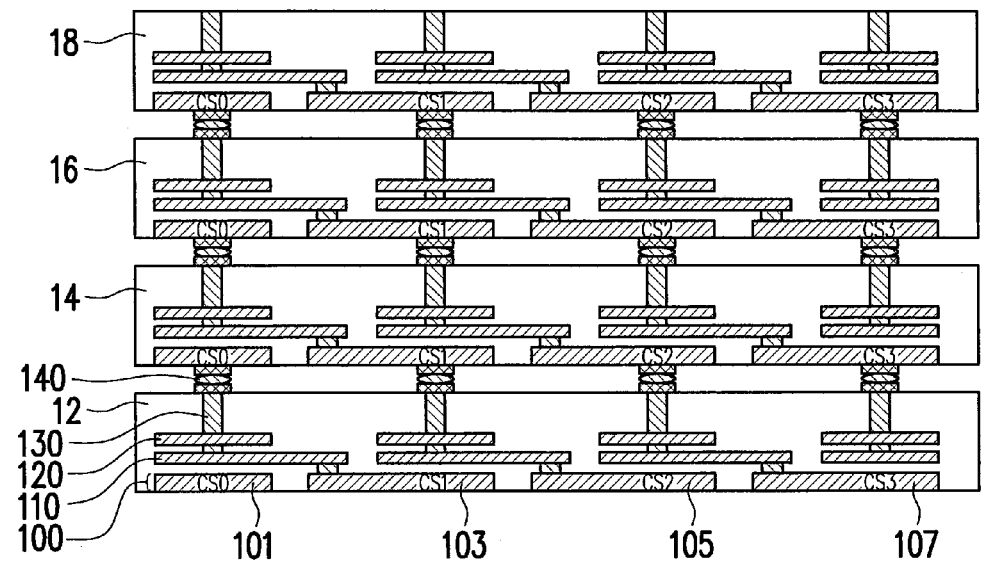
FIG. 1 illustrates a conventional multi-die stack structure of QDP type with a ladder-style connection between the dies that is based on CS (Chip-Select) pads.

Moreover, the CS1 pad 103 of the $4^{th}$ die 18 is electrically connected with the CS2 pad 105 of the $3^{rd}$ die 16 via a TSV 130 in the $3^{rd}$ die 16, and with the CS3 pad 107 of the $2^{nd}$ die 14 via a TSV 130 in the $2^{nd}$ die 14 to form a 2-step ladder, and the CS2 pad 105 of the $4^{th}$ die 18 is electrically connected with the CS3 pad 107 of the $3^{rd}$ die 16 via a TSV 130 in the $3^{rd}$ die 16 to form a 1-step ladder. The above-mentioned pads and the CS3 pad 107 of the $4^{th}$ die 18 are not used in the conventional multi-die stack structure of QDP type as shown in FIG. 1.

However, in the multi-die stack structure of QDP type of this embodiment of this invention, the following additional connections are also included.

The CS0 pad 101 of the $4^{th}$ die 18, which has been electrically connected with the CS1 pad 103 of the $3^{rd}$ die 16, the CS2 pad 105 of the $2^{nd}$ die 14 and the CS3 pad 107 of the $1^{st}$ die 12 through three TSVs 130, is electrically connected with the TSV 130 in the $4^{th}$ die 18 and over the CS3 pad 107 of the $4^{th}$ die 18 via an extension 110a of the M2 layer 110 of the $4^{th}$ die 18, as indicated by the corresponding arrow 150. Thus, the CS0 pad 101 of the $4^{th}$ die 18 sees three other CS pads and four TSVs 130.

The CS0 pad 101 of the $1^{st}$ die 12 is electrically connected with the CS3 pad 107 of the $2^{nd}$ die 14 via an extension 110a of the M2 layer 110 of the $1^{st}$ die 12 (indicated by the corresponding arrow 150), a TSV 130 in the $1^{st}$ die 12, and so on. Thus, the CS0 pad 101 of the $1^{st}$ die 12 is also electrically connected with the CS2 pad 105 of the $3^{rd}$ die 16 and the CS1 pad 103 of the $4^{th}$ die 18 both electrically with the CS3 pad 107 of the $2^{nd}$ die 14, and thereby sees three CS pads and four TSVs 130 in total, like the CS0 pad 101 of the $4^{th}$ die 18 does.

The CS0 pad 101 of the $2^{nd}$ die 14 having been electrically connected with the CS1 pad 103 of the $1^{st}$ die 12 is further electrically connected with the CS3 pad 107 of the $3^{rd}$ die 16 via an extension 110a of the M2 layer 110 of the $2^{nd}$ die 14 (indicated by the corresponding arrow 150), a TSV 130 in the $2^{nd}$ die 14, and so on, so that it is also electrically connected with the CS2 pad 105 of the $4^{th}$ die 18 electrically with the CS3 pad 107 of the $3^{rd}$ die 16 to see three CS pads and four TSVs 130 in total, like the CS0 pad 101 of the $4^{th}$ die 18 does.

The CS0 pad 101 of the $3^{rd}$ die 16 having been electrically connected with the CS1 pad 103 of the $2^{nd}$ die 14 and the CS2 pad 105 of the $1^{st}$ die 12 is further electrically connected with the CS3 pad 107 of the $4^{th}$ die 18 via an extension 110a of the M2 layer 110 of the $3^{rd}$ pad 16 (indicated by the corresponding arrow 150), a TSV 130 in the $3^{rd}$ pad 16, and so on, so that it is also electrically connected with the CS2 pad 105 of the $4^{th}$ die 18 electrically with the CS3 pad 107 of the $3^{rd}$ die 16 to see three CS pads and four TSVs 130 in total, like the CS0 pad 101 of the $4^{th}$ die 18 does.

Because the CS0 pad of any die in the QDP-type multi-die stack structure in the above embodiment is electrically connected with three other CS pads and four TSVs, the Cin difference between the CS/ZQ pads of the four dies is substantially eliminated.

In addition, each through-substrate via 130 may be a through-silicon via, for example, in case the substrate is a silicon substrate. In addition, the four dies 12, 14, 16 and 18 may be DRAM dies, which may be DDR3 DRAM dies. Nevertheless, this invention is not restricted to be applied thereto, and may be applied to any stacked die structure using TSVs where a ladder-style connection is used.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A multi-die stack structure, comprising N dies stacked vertically, wherein
   N is an integer larger than or equal to 2,
   each die comprises N die-specific input pads, wherein a specific pad among the N pads is for an input of the die,
   the specific pad of each die above a bottom die is electrically connected with a different pad of the bottom die other than the specific pad of the bottom die, via at least one through-substrate via and, when not being in the die neighboring to the bottom die, also via a different pad of each underlying die above the bottom die, and
   the specific pad of the bottom die is electrically connected with at least one pad of the overlying die(s) that is not the specific pad of any overlying die and not any pad electrically connected with the specific pad of any overlying die.

2. The multi-die stack structure of claim 1, wherein the die-specific input pads are chip-select (CS) pads.

3. The multi-die stack structure of claim 1, wherein the at least one through-substrate via comprises at least one through-silicon via.

4. The multi-die stack structure of claim 1, wherein the N dies comprise DRAM dies.

5. The multi-die stack structure of claim 1, wherein the DRAM dies comprise DDR3 DRAM dies.

6. The multi-die stack structure of claim 1, wherein
   the N dies comprise, from bottom to top, $1^{st}$ to $N^{th}$ dies, wherein the $1^{st}$ die is the bottom die,
   in each die, the N pads comprise $1^{st}$ to $N^{th}$ pads in sequence, wherein the $1^{st}$ pad is the specific pad for the input of the die
   in each $i^{th}$ die (i=2 to N), the $j^{th}$ pad (j=1 to N−1) is electrically connected with the (j+k)-th pad of each (i−k)-th die (k=1 to i−1), with a proviso of j+k≤N,
   the specific pad of the $1^{st}$ die is electrically connected with the $N^{th}$ pad of the $2^{nd}$ die via a through-substrate via in the $1^{st}$ die,
   the specific pad of each $m^{th}$ die (m=2 to N−1) is also electrically connected with the $N^{th}$ pad of the (m+1)-th die via a through-substrate via in the $m^{th}$ die, and
   the specific pad of the $N^{th}$ die is also electrically connected with a through-substrate via that is in the $N^{th}$ die and over the $N^{th}$ pad of $N^{th}$ die.

7. The multi-die stack structure of claim 6, wherein the die-specific input pads are chip-select (CS) pads.

8. The multi-die stack structure of claim 6, wherein the specific pad of each $m^{th}$ die is electrically connected with the $N^{th}$ pad of the (m+1)-th die via a circuit including an extension of a metal layer in the $m^{th}$ die, and a through-substrate via.

9. The multi-die stack structure of claim 6, wherein N is equal to 4.

10. The multi-die stack structure of claim 6, wherein the at least one through-substrate via comprises at least one through-silicon via.

11. The multi-die stack structure of claim 6, wherein the N dies comprise DRAM dies.

12. The multi-die stack structure of claim 11, wherein the DRAM dies comprise DDR3 DRAM dies.

* * * * *